US010613927B1

(12) United States Patent
Symons et al.

(10) Patent No.: US 10,613,927 B1
(45) Date of Patent: Apr. 7, 2020

(54) SYSTEM AND METHOD FOR IMPROVED MEMORY ERROR RATE ESTIMATION

(71) Applicant: Toshiba Memory Corporation, Minato-ku (JP)

(72) Inventors: David Malcolm Symons, Kidlington (GB); Paul Edward Hanham, Marlborough (GB); Francesco Giorgio, Headington (GB)

(73) Assignee: TOSHIBA MEMORY CORPORATION, Tokyo (JP)

( * ) Notice: Subject to any disclaimer, the term of this patent is extended or adjusted under 35 U.S.C. 154(b) by 32 days.

(21) Appl. No.: 15/917,350

(22) Filed: Mar. 9, 2018

(51) Int. Cl.
| | |
|---|---|
| *G06F 11/10* | (2006.01) |
| *H03M 13/39* | (2006.01) |
| *G11C 29/42* | (2006.01) |
| *G11B 20/18* | (2006.01) |
| *H03M 13/45* | (2006.01) |

(52) U.S. Cl.
CPC ........ *G06F 11/1048* (2013.01); *G11B 20/182* (2013.01); *G11B 20/1876* (2013.01); *G11C 29/42* (2013.01); *H03M 13/39* (2013.01); *H03M 13/45* (2013.01)

(58) Field of Classification Search
CPC ... G06F 11/1048; H03M 13/45; H03M 13/39; G11B 20/1876; G11B 20/182; G11C 29/42
See application file for complete search history.

(56) References Cited

U.S. PATENT DOCUMENTS

| | | | | |
|---|---|---|---|---|
| 9,954,558 | B1* | 4/2018 | Steiner | H03M 13/3784 |
| 2006/0013328 | A1* | 1/2006 | Zhang | H04B 1/7105 |
| | | | | 375/267 |
| 2010/0192043 | A1* | 7/2010 | Alrod | H03M 13/1111 |
| | | | | 714/763 |
| 2010/0199149 | A1* | 8/2010 | Weingarten | G06F 11/1068 |
| | | | | 714/773 |
| 2017/0269993 | A1* | 9/2017 | Maffeis | G11C 29/52 |

OTHER PUBLICATIONS

V. Gherman, E. Farjallah, J. Armani, M. Seif and L. Dilillo, "Improvement of the tolerated raw bit error rate in NAND flash-based SSDs with the help of embedded statistics," 2017 IEEE International Test Conference (ITC), Fort Worth, TX, 2017, pp. 1-9. (Year: 2017).*

(Continued)

*Primary Examiner* — Cynthia Britt
(74) *Attorney, Agent, or Firm* — Foley & Lardner LLP

(57) ABSTRACT

A method for fast calculation of a frame error rate (FER) of an error correcting code (ECC) soft decoder using a soft read process includes determining an MI-FER conversion data structure based on a relationship between mutual information (MI) of input channels and output channels of a memory, and FER of the ECC soft decoder, and decoding an encoded data codeword stored in a memory page of the memory and read using a soft read process. The method further includes generating a set of joint probability values using the information from the soft read process and data indicating true bit values for the data codeword, determining an MI value using the set of joint probability values, and determining an FER estimate using the MI-FER conversion data structure.

20 Claims, 5 Drawing Sheets

(56) References Cited

OTHER PUBLICATIONS

M. N. Kaynak, P. R. Khayat and S. Parthasarathy, "On Die Bit Error Rate Estimator for NAND Flash Memory," in IEEE Transactions on Circuits and Systems II: Express Briefs, vol. 64, No. 7, pp. 772-776, Jul. 2017. (Year: 2017).*

J. Wang et al., "Enhanced Precision Through Multiple Reads for LDPC Decoding in Flash Memories," in IEEE Journal on Selected Areas in Communications, vol. 32, No. 5, pp. 880-891, May 2014. (Year: 2014).*

J Wang et al. "LDPC Decoding with Limited-Precision Soft Information in Flash Memories" (or arXiv:1210.0149v1 [cs.IT] for this version) Sep. 29, 2012 (Year: 2012).*

Wang et al., "Soft Information for LDPC Decoding in Flash: Mutual-Information Optimized Quantization", IEEE Globecom, 2011.

* cited by examiner

| p(x,y) | X | |
|---|---|---|
| | 0 | 1 |
| Y Level 0 | p(0,L0) | p(1,L0) |
| Level 1 | p(0,L1) | p(1,L1) |
| Level 2 | p(0,L2) | p(1,L2) |
| Level 3 | p(0,L3) | p(1,L3) |

Conditional Probability Table 300

FIG. 3

SYSTEM AND METHOD FOR IMPROVED MEMORY ERROR RATE ESTIMATION

TECHNICAL FIELD

The present disclosure generally relates to systems and methods for improved memory error rate estimation, including systems and methods that determine error rates of NAND flash non-volatile memory based on determined mutual information (MI).

BACKGROUND

Memory devices such as NAND flash non-volatile memory devices are particularly vulnerable to errors in the data being read from the memory cells. A measure of the rate of errors, known as the Bit Error Rate (BER), is an important quantity which determines error detection and correction schemes and other data integrity functions. Another important measure is the Frame Error Rate (FER), which is the rate of errors in decoded frames of data from the error correction scheme. However, the determination of the FER is a time consuming task, where typical error rates of the order of one in a million or even less can involve millions of write and read test operations in order to arrive at an accurate FER estimation.

BRIEF DESCRIPTION

NAND flash error rates vary greatly as the memory ages and with memory usage—in particular with the number of Program/Erase (P/E) cycles experienced by the memory, the effect of programming and reading cells on adjacent cells and the length of time data bits have been stored in the memory cells. In addition, in a memory system such as a Solid State Drive, there may be multiple memory devices, each with their own individual error characteristics and with memory blocks within each memory device also with their own individual characteristics. Different Error Correction Codes (ECC) of varying strength may be used, such as Hamming, Bose-Chaudhuri-Hocquenghem (BCH), Low-Density Parity Check (LDPC), product codes and other correction codes. In a system such as a solid-state drive (SSD), the selection of the optimal error correction strategy of each individual memory device and memory block within each individual memory device of the SSD is key to the optimal operation of the SSD as a whole. In particular, optimal operation of LDPC decoders depends highly on the accurate determination of FER. However, as mentioned above, in comparative systems using comparative methods, the determination of FER is a time consuming task, where typical error rates of the order of one in a million can involve millions of write and read test operations in order to arrive at an accurate FER estimation.

One or more embodiments described herein address at least this issue. Systems and methods described herein provide for an improved manner of determining FER using a number of read processes that is orders of magnitude smaller than a number of read processes used in comparative systems. For example, while comparative systems use millions of read processes to arrive at an accurate FER estimation, embodiments described herein provide for controllers and modules specifically configured to perform processes that provide for determining FER with accuracy using a number of read processes in a range of one to ten, or in a range of one to one hundred. In some embodiments, a single read process may be implemented (which may involve a hard read operation, and may involve one or more soft read operations) to accurately determine FER. The hardware, processes, and algorithms described herein can provide for this improved determination of FER. The determined FER can be used, for example, to select or calibrate an ECC, which can conserve computing resources by avoiding selection of a resource-intensive ECC that is stronger than needed or desired.

In one or more embodiments, according to a first aspect, method for fast calculation of a frame error rate (FER) using a soft read process includes determining an MI-FER conversion data structure based on a relationship between mutual information (MI) of input channels and output channels of a memory, and FER of an Error Correction Code (ECC) soft decoder, and decoding an encoded data codeword stored in a memory page read using a soft read process. The method further includes generating a set of joint probability values using the soft read information and data indicating true bit values for the data codeword, determining an MI value using the set of joint probability values, and determining an FER estimate using the MI-FER conversion data structure.

In one or more embodiments, according to a second aspect, a system for implementing an improved FER estimation of a computer memory includes a computer memory storing an encoded data codeword in a memory page, and a memory controller configured to determine an MI-FER conversion data structure based on a relationship between MI of input channels and output channels of a memory, and FER. The memory controller includes an ECC decoder configured to decode the encoded data codeword stored in the memory page using a soft read process, a conditional probability module configured to generate a set of joint probability values using the soft read information and data indicating true bit values for the data codeword, and an MI generator configured to determine an MI value using the set of joint probability values. The controller is further configured to determine an FER estimate using the MI-FER conversion data structure.

BRIEF DESCRIPTION OF THE FIGURES

FIG. 3 shows a conditional or joint probability table of conditional probabilities of bit values given charge state levels, according to one or more embodiments of the present disclosure.

DETAILED DESCRIPTION

The embodiments described herein provide for certain improvements, including providing for implementing a memory FER estimation process that is based on determining MI. One or more of the embodiments described herein provide for determining MI values using a decoded ECC codeword and read (e.g. soft read) information from the memory.

An improvement concerns a system and method for the rapid estimation of FER of a memory, whereby a successfully decoded ECC codeword (in other words a codeword which accurately (e.g. exactly) represents the codeword as originally stored in the memory), is presented as input to a conditional probability module along with soft information derived from multiple reads of the codeword stored in memory. The conditional probability module includes a bit probability statistics generator which provides summary statistics of the conditional probability of data bits given the measured charge state of the memory cell. The summary statistics are then used in a calculation to determine the MI of the memory input and output which may then be used to estimate FER, using a look up table, interpolation or extrapolation calculation based on a previously determined relationship between MI and FER using a computer model of the memory and soft decoder.

Figure 1:
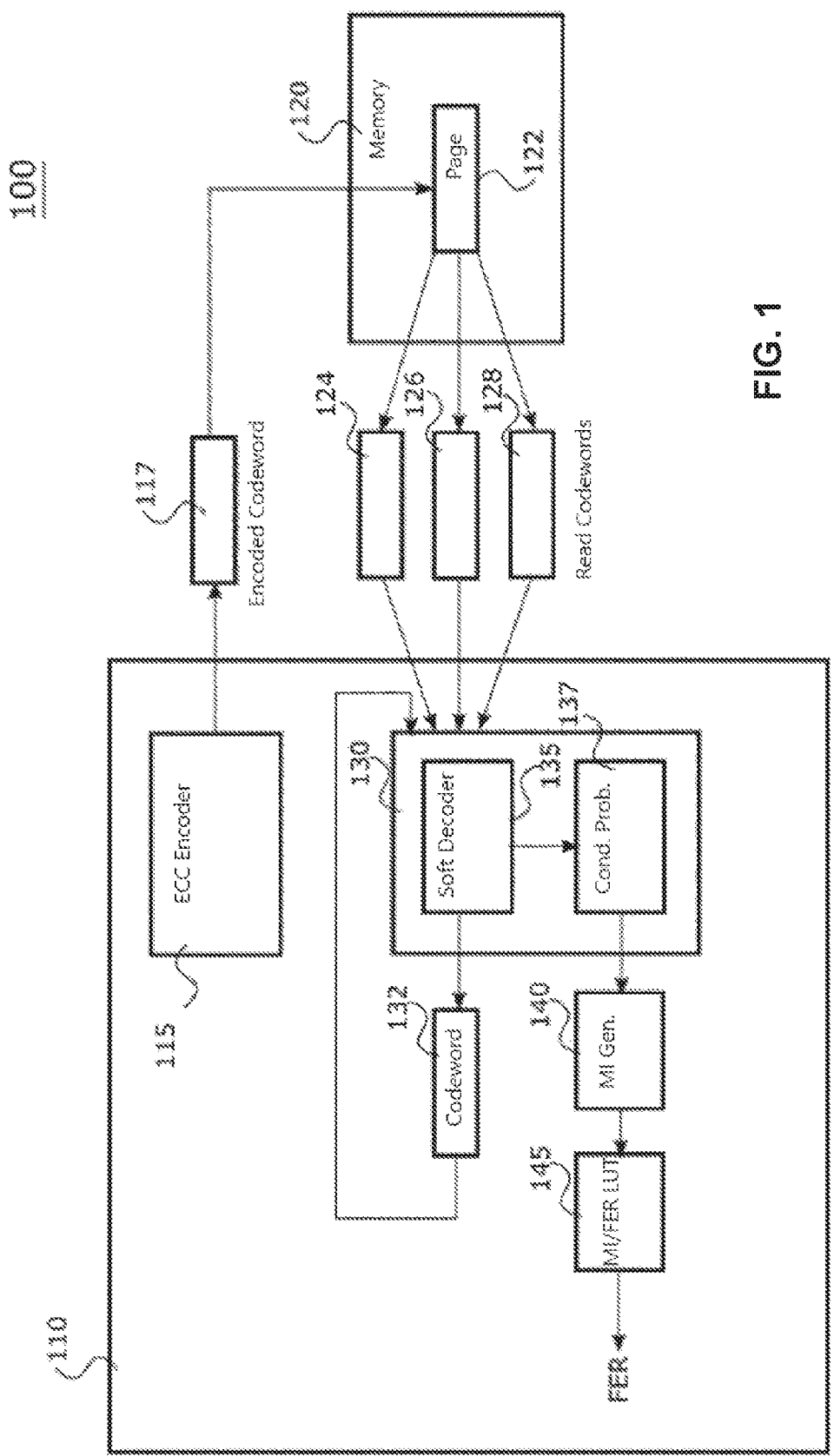
FIG. 1 shows a block diagram of a memory FER estimation system according to one or more embodiments of the present disclosure.

FIG. 1 shows block diagram of a memory FER estimation system 100 according to one or more embodiments of the present disclosure. A memory controller 110 programs (writes or stores) data into, and reads data from, a memory 120. The memory controller 110 comprises an ECC encoder 115, an ECC decoder 130, an MI generator 140 and an MI-FER conversion data structure (e.g. an MI/FER look up table (LUT) 145). An encoded codeword 117 is stored in memory 120 as memory page 122. When data contained in page 122 is requested to be read, a number of read requests are made at varying read thresholds to give codewords 122, 124 and 126 and presented to ECC decoder 130. A correctly decoded codeword 132 is produced. ECC decoder 130 comprises a soft decoder module 135 and a conditional probability module 137. Although shown in FIG. 1 as just three read request providing three codewords (for clarity), as many read requests may be made as necessary in order to produce a correctly decoded codeword 132. In some implementations the correctly decoded codeword is produced from a single read using a single read threshold (referred to as a 'hard' read), then fed back to the ECC decoder 130 and combined with codewords from further read requests (known as 'soft' reads) to provide data for conditional probability module 137. In some implementations, multiple codewords from multiple reads are made in one step to produce correctly decoded codeword 132 and data for conditional probability module 137.

In some implementations, rather than using the ECC decoder 130 to decode an encoded codeword to generate the correctly decoded codeword 132 (which can indicate true or known bit values used by the conditional probability module 137), a predetermined test pattern may be implemented (e.g. as the codeword, or in place of the codeword). Because the predetermined test pattern is known in advance, the test pattern can serve as data that indicates true or known bit values, and a decoding process to generate the correctly decoded codeword 132 can be omitted. In some implementations, the ECC decoder 130 may also be omitted, and the codewords 124, 126, and 128, and the test pattern may be used by the conditional probability module 137 (e.g. to perform the functions described below).

Conditional probability module 137 outputs statistic to MI generation module 140, which output MI data which is applied to an MI/FER LUT 145 which gives an estimation of FER as result. The FER estimation system 100 is able to provide estimates of FER by making three or more read requests of a memory page 122 in memory 120 (e.g. as part of a single soft read process). This is in comparison to comparative systems that make millions of read requests to a memory in order to gather enough data to generate an accurate estimation of FER.

Figure 2:
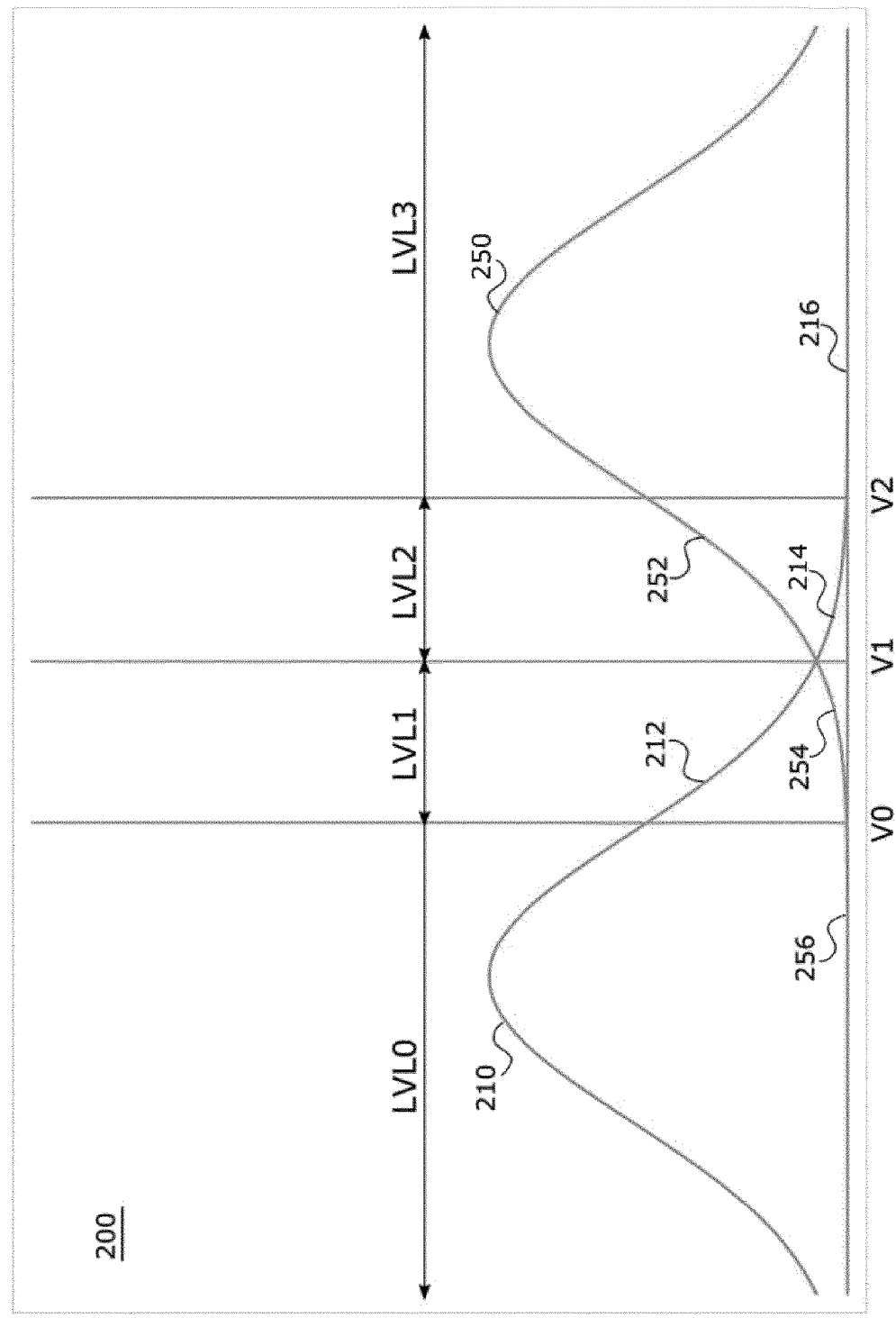
FIG. 2 shows Gaussian distributions of two memory cell charge states with soft read voltage thresholds levels according to one or more embodiments of the present disclosure.

Referring now to FIG. 2, details of performing soft reads with multiple read requests to a memory cell are shown. Two Gaussian charge distributions 200 are shown that represent two charge states, where the state of the cell may be taken represent a data bit '0' or '1' according to the charge state, or a multiple bit representation like '00', '01', '000', '0001' etc. when multiple bits are to be stored in a cell. For clarity we assume the two charge states represent a single bit state, which may be a least significant bit (LSB), most significant bit (MSB) etc. when the charge states represent multiple bits. Writing data involves programming a cell with a charge, which is a statistical process, where the probability that a memory cell has a threshold voltage (y axis) is plotted against a read voltage (x axis) used to measure the charge in a cell. Shown are three vertical lines representing three voltage thresholds that are used by a read process to determine the state of charge in the memory cell. A Gaussian distribution is chosen to conveniently model the behavior of an actual memory cell with a ventral peak showing the most probable state of charge with side lobes showing the diminishing probability of charge state of the cell charge, but other charge distributions are possible (e.g. depending on the write process used to program the memory cell, and characteristics of the memory cell). Although these distributions as shown are symmetrical and equal in size, they may differ in size, breadth and symmetry for each charge state. These parameters may vary during the lifetime of the memory cell according to the number of P/E cycles the memory block has undergone, or the length of time charge has been stored in the memory cells, for instance. The read processes may be performed by a circuit or other electronic module including a processor (e.g. a microprocessor, an application-specific integrated circuit (ASIC), a field-programmable gate array (FPGA), etc., or combinations thereof) to determine a bit value for a memory unit (e.g. a memory cell) of a memory page or memory block of a computer memory device. The computer memory device may include, but is not limited to, electronic, magnetic, or any other storage or transmission device capable of storage of data bits. The memory may include NAND flash memory, Phase Change Memory (PCM), Magnetic RAM (MRAM), Ferroelectric RAM (Fe-RAM) or any other suitable memory capable of storage of data bits. The memory block may be defined as a plurality of bits (e.g. bits in a sequence) of the memory.

A read process can be implemented on a memory cell to determine a charge level of the cell and, correspondingly, a bit setting (e.g. a binary setting of "0" or "1"). In some read processes, a single read operation (or read request at a read voltage) is performed. Such a process may be referred to as a hard read process. In a hard read process, the single read operation may be performed using a single read parameter, such as a predetermined read voltage (e.g. at a voltage value about midway between the peaks of the possible charge states being read, or at any other appropriate value), and if the measured charge state of the cell is determined to be in a state above the predetermined voltage threshold, the bit is read to be a "1" (or "0"). If the measured charge state of the cell is determined to be below the predetermined voltage threshold, the bit is read to be a "0" (or "1"). Such determinations can be made, for example, using a read circuit including a comparator circuit that compares the current flowing in the cell being read to a predetermined value.

Referring to FIG. 2, one distribution curve including portions 210, 212, 214, 216 represents the possible charge state of a cell programmed with a '0' and the other distribution curve including portions 250, 252, 254, 256 represents the possible charge state of a cell programmed with a '1'. The height of the curve indicates the probability that a cell programmed will have a threshold voltage corresponding to the read voltage (where the read voltage level increases to the right along the x axis). Thus, a cell programmed with a '0' is most likely to exist in a state in the region 210 of the curve, but may exist with lower probability in region 212, even lower probability in region 214 and with almost zero probability in region 216.

The read process 200 depicted in FIG. 2 is a soft read process. A soft read process is a read process that implements multiple reads at more than a single read parameter, such as a number of independent reads each with a different read voltage, and determines which of a plurality of charge levels the charge of the cell being read falls in to. In some embodiments the read parameter and cell quantity being measured may be any electrical quantity, such as a voltage, current, resistance, capacitance or inductance. The read process 200 employs a number of read voltages in order to determine the voltage threshold of the cell. As shown, three read voltages V0, V1 and V2 are used. With three read voltages, the voltage threshold may be determined to be in one of four levels, LVL0, LVL1, LVL2 and LVL3. The soft read process implements a plurality of read operations to determine which of the levels corresponds to the voltage threshold of the cell being read. In the read process 200, a first read operation is implemented using a middle read voltage V1 that defines a boundary between voltage threshold levels LVL0/LVL1 and LVL2/LVL3. The read circuit may determine that the voltage threshold of the cell is above the middle read voltage V1 (meaning that the charge level of the cell falls within LVL2 or LVL3), and may accordingly determine to implement a second read process at the highest read voltage V2 to determine whether the voltage threshold of the cell falls within LVL2, or within LVL3. Thus, by performing two read operations the read process 200 can determine where, in the curve ranging from the portion 252 to the portion 250, the voltage threshold of the cell falls.

By determining a voltage threshold level of the cell at a higher resolution, the soft read process can provide a processor performing a read operation (e.g. using a read circuit) with additional information that hard read process does not provide. For example, in a hard read process using only voltage V1, the read process can determine if the voltage threshold is either below V1, in LVL0 or LVL1, or above V1, in LVL2 or LVL3. However a cell that was originally programmed as a '1' (the right hand distribution) may actually have a voltage threshold at LVL1 in the 'tail' portions 254, 256 of the right hand distribution. A hard read using voltage V1 would determine this cell's voltage threshold to be below the voltage V1 somewhere in LVL0 or LVL1 and determine the bit value to be '0'. Similarly, if the cell were programmed as a '0' and was somewhere in the left hand distribution, the charge may actually lie in the tail 214, 216 of the left hand distribution. In this case a hard read using voltage V1 would determine this cell to be above V1 somewhere in LVL2 or LVL3 and determine the bit value to be '1'. Either case results in a bit error of the cell being read, since the bit value as read differs from the bit value as originally stored (or originally intended to be stored).

However, if two further read voltages were implemented, V0 and V2, lying either side of V1 and selected to encompass the possible width of the tails of the distributions, then these read voltages can be used to distinguish between voltage thresholds in LVL0 and LVL1, or LVL2 and LVL3.

Hence, in the above example of a bit programmed with a '0' with a voltage threshold lying somewhere in the left hand distribution, after performing the first read at voltage V1 and determining the voltage threshold was below V1 in LVL0 or LVL1, a second read could be performed at V0. Then a level of certainty can be attached to the value of the bit. If the voltage threshold lies in LVL0, the bit may be determined to be a '0' with a high degree of certainty, say 95%. If the voltage threshold lies in LVL1 (since the first read found that the voltage threshold was either in LVL0 or LVL1), the bit may be determined to be a '0' with a lesser degree of certainty, say 85%, which would mean it was equivalent to being a '1' with a 15% degree of certainty. This is because there is no real way of knowing if the voltage threshold LVL1 was due to the cell being programmed with a '0' resulting in a voltage threshold in the region of the distribution curve 212, or whether it was programmed with a '1' and lay in the left hand tail 254 of the right hand distribution curve. The certainties may be calculated based on the relative areas under the curve portions 212 and 254, for example. In the same way, in the above example of a cell programmed with a '1', after performing the first read at voltage V1 and determining the voltage threshold was above the voltage V1 in LVL2 or LVL3, a second read could be performed at V2. Then a level of certainty can be attached to the value of the bit. If the voltage threshold lies in LVL3, the bit may be determined to be a '1' with a high degree of certainly, say 95%. If the voltage threshold lies in LVL2, the bit may be determined to be a '1' with a lesser degree of certainly, say 85%, which would mean it was equivalent to being a '0' with a 15% degree of certainty. These bit certainties may be expressed as additional bits of soft read information which can be used by a soft decoder such as an LDPC decoder, to improve the quality of decoding with fewer bit errors.

Referring now to FIG. 3, a conditional or joint probability table 300 is shown. The conditional probability table 300, or data shown in the conditional probability table 300, shows the conditional or joint probability of a cell bit value being a 0 or 1, given a corresponding charge level. Hence, p(0,L0) is the probability that the input (or stored) bit was 0 and the soft read process determined it to be in level 0. The depicted probability data relates to a read process that includes four charge levels and, correspondingly, three read operations, typically one hard read at one read voltage and two soft reads at voltages on either side of the hard read voltage. The conditional probability table 300 may also be constructed for read processes that have more than four charge levels (e.g. read processes that have seven voltage threshold levels, or any other specified number of voltage threshold levels), and that have a different number of read operations (e.g. one hard read with four soft read operations or any other specified number of read operations).

In order to fill in values for table 300, in one implementation an ECC decoder 130 comprises a soft read decoder 135 and a probability statistics generator 137. The ECC decoder 130 uses the correctly decoded codeword 132 from a reading a memory page 122 along with data accumulated from a decoding using codewords 124, 126, 128 read using a soft read decoder 135. The data accumulated in probability statistics generator 137 comprises summing a count p(x,y) for each bit in the codeword, being the correctly decoded bit of value x with a corresponding charge state y determined from the soft reads. For example, in a codeword comprising 4096 bits, each bit may be referred to by an index i where i=0.4095, with the correctly decoded bit value at index i being X(i) and the corresponding charge state that was read being Y(i). Hence, if X(i)=0 and Y(i)=Level 1, the count p(0,L1) is incremented; if X(i)=1 and Y(i)=Level 3, count p(1,L3) is incremented and so on. The counts summed over where i=0.4095 may be used directly as probability values, or normalized by dividing by the total number of bits in the codeword (4096).

In some embodiments, the table 300 can be filled out using a hard read information (e.g. using only hard read information, without using soft read information), and the table may only include two possible charge levels. In such embodiments, a codeword determine by a hard read process may be used, rather than codewords 124, 126, 128. One or more hard reads (across which a read parameter such as a voltage, current, resistance, capacitance or inductance is kept constant) may be used to generate data for the table 300.

The values of joint probabilities in table 300 may be constructed for any memory page or codeword being read, with no or little overhead on the normal read process if a soft read were being performed in any case in order to decode the data, or with the overhead of just two soft reads if correct data were successfully decoded with a single hard read. The values of joint probabilities in table 300 are calculated by probability statistics generator 137 and passed to MI generator 140.

The MI generator 140 can include circuits, components, subsystems, modules, scripts, applications, or one or more sets of computer-executable instructions for determining MI values of inputs and outputs of a memory. The MI generator 140 may use the information included in the probability table 300 to determine a respective MI value for each read process of a set of read processes.

The MI generator 140 can determine a respective MI value for each read process, for example, as follows. Consider an input channel X of a storage channel, for example the bits originally stored in a memory, where the bits are either 0 or 1 and an output channel Y, for the example the bits as read from the memory, where the bits are in one of a plurality of soft read levels. The MI of X and Y ("I(X;Y)") may be given by the following expression:

$$I(X;Y)=H(Y)-H(Y|X) \quad \text{(Equation 1)}.$$

Where H(Y) is the marginal entropy of Y and H(Y|X) is the conditional entropy of Y, given X. The marginal distribution of Y ("H(Y)") may be given by:

$$H(Y)=-\Sigma_y p(y)\log_2 p(y) \quad \text{(Equation 2)}.$$

The conditional entropy ("H(Y|X)") may be given by:

$$H(Y|X) = -\sum_x \sum_y p(x,y)\log_2 p(y|x) \text{ or} \quad \text{(Equation 3)}$$

$$H(Y|X) = -\sum_x \sum_y p(x)p(y|x)\log_2 p(y|x)$$

where p(y) is the probability distribution of y, p(x,y) is the joint probability distribution of x and y, and p(y|x) is the probability distribution of y given x. Probabilities referenced herein may refer to estimated probabilities based on recorded incidences (e.g. based on relative incidences).

As discussed above, the probability table 300 shown in FIG. 3 shows the joint probability distribution, where p(0, L0) is the probability that the input bit was 0 (the bit originally stored had a "true" or "known" value of 0) and soft read commands read the bit value as being in level 0. The probabilities of all the cells in the table sum to 1. The probability distribution of y, p(y) is given by summing the rows. The distribution p(y|x=0) is given by the probabilities in the x=0 column, normalised so that they sum to 1. Other distributions may be determined, or given, in a similar and corresponding manner.

The MI generator 140 may determine MI values for the plurality of read processes as described above and/or using the equations described above, or in any other appropriate manner.

Figure 4:
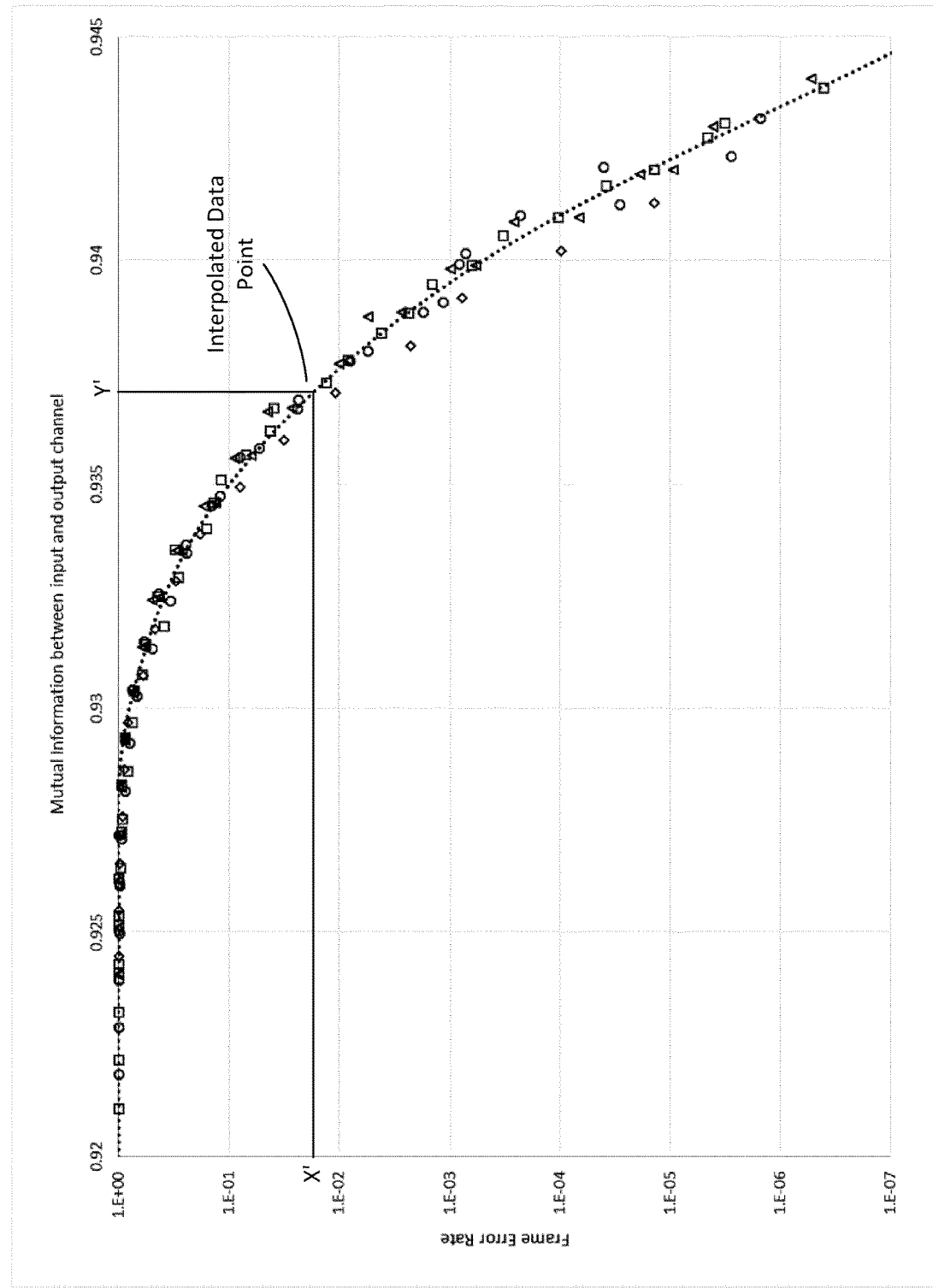
FIG. 4 is a plot showing data that indicates a relationship between MI values and FERs.

Referring now to FIG. 4, FIG. 4 shows a plot 400 of simulated data points showing an FER for a given MI value. Specifically, FIG. 4 shows a plurality of simulations that are run under different assumptions or conditions. Each set of data points (denoted by squares, triangle, circles and diamonds) represents a simulation having a varied parameter of the distributions of charge stored in a memory cell. Examples of parameters that may be varied are the variance of the voltage threshold distributions and the number and spacing of soft read voltages used. As shown in FIG. 4, even across the varied parameter values, the lines are relatively close to one another and tend to follow a similar average curve, denoted by the dotted line. A model or function can be determined based on the data points shown in FIG. 4, or based on other data points that show plurality of FERs corresponding to a series of MI values, by applying one or more fitting techniques. The model can be represented by an MI-FER conversion data structure, such as a look up table (e.g. the FER LUT 145) or calculation function which may be used to determine an FER that corresponds to an MI calculated by MI generator 140. In one or more embodiments, the FER LUT 145 may be determined, generated, accessed, or retrieved by the memory controller 110 to perform processes described herein, such as estimating the FER value using the MI value generated by the MI generator 140. For values of MI that do not correspond to previously calculated data points, such as the value Y', the memory controller 110 may perform interpolation or equivalent calculations to determine interpolated values of FER, such as the value X'.

Figure 5:
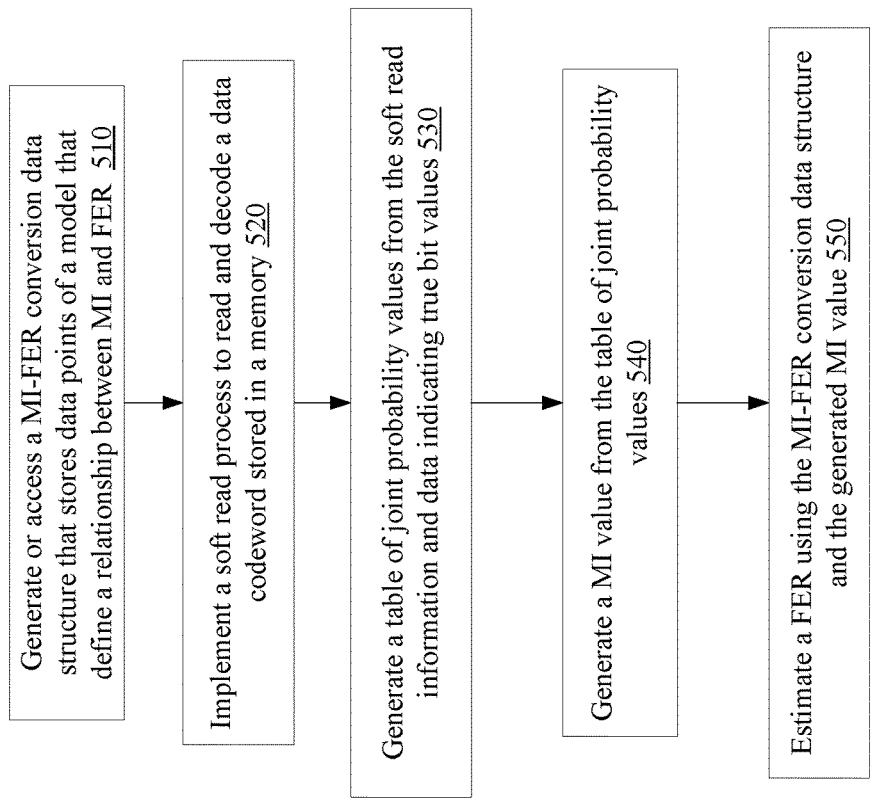
FIG. 5 shows a method for the fast estimation of FER according to one or more embodiments of the present disclosure.

Referring now to FIG. 5, a method for the fast calculation of FER using a soft read process according to one or more embodiments is shown. The method may be implemented using the FER estimation system 100. In operation 510, an MI-FER conversion data structure is generated or accessed that stores data points of a model that define a relationship between MI and FER. In operation 520, a data codeword stored in a memory page is read and decoded by an ECC decoder using a soft read process. In operation 530, the ECC decoder generates a table of joint probability values from the soft read information and data indicating true bit values, which may be a known stored data codeword or the correctly decoded data codeword. In operation 540, an MI generator generates an MI value using the table of joint probability values. In operation 550, an estimated FER is generated using the MI-FER conversion data structure and the generated MI value.

What is claimed is:

1. A method for fast calculation of a frame error rate (FER) of an Error Correction Code (ECC) soft decoder, comprising:
   determining a MI-FER conversion data structure based on a relationship between mutual information (MI) of input channels and output channels of a memory, and FER of the ECC soft decoder;
   decoding, using the ECC soft decoder, an encoded data codeword stored in a memory page of the memory and read using a soft read process;

generating a set of joint probability values using information from the soft read process and data indicating true bit values for the encoded data codeword;

determining a MI value using the set of joint probability values; and determining a FER estimate using the MI-FER conversion data structure.

2. The method of claim 1, wherein the MI-FER conversion data structure is a lookup table that stores data points of a model.

3. The method of claim 2, wherein determining the FER estimate using the MI-FER conversion data structure comprises interpolating between the data points of the model or extrapolating beyond the range of the data points of the model to determine a FER estimate that corresponds to the determined MI value.

4. The method of claim 1, wherein the input channels comprise one or more encoded codewords stored in the memory and the output channels comprise data codewords read from the memory.

5. The method of claim 4, wherein the encoded codewords stored in the memory page comprise data indicating true bit values that were encoded and programmed to memory.

6. The method of claim 5, wherein the data codeword is a known test pattern and the data indicating true bit values comprises the test pattern values.

7. The method of claim 5, wherein the data indicating true bit values comprises data generated by a decoding by the ECC soft decoder, of the data codeword stored in the memory page, the data generated by the decoding being read using a read process.

8. The method of claim 7, wherein the read process performed on the data codeword stored in the memory page is the soft read process.

9. The method of claim 1, wherein no more than one soft read process is performed.

10. The method of claim 9, wherein the no more than one soft read process uses one or more independent reads of the memory.

11. The method of claim 1, wherein generating the set of joint probability values comprises determining a count of each true bit value-determined charge state level pair for the decoded data codeword.

12. The method of claim 11, wherein the MI value is determined using relative incidences of the true bit value-determined charge state level pairs.

13. A system for implementing an improved FER estimation of a computer memory, comprising:

computer memory storing an encoded data codeword in a memory page; and a memory controller configured to determine a MI-FER conversion data structure based on a relationship between MI of input channels and output channels of the computer memory, and the FER of an ECC decoder, the memory controller comprising:

an ECC decoder configured to decode the encoded data codeword stored in the memory page and read using a soft read process;

a conditional probability module configured to generate a set of joint probability values using information from the soft read process and data indicating true bit values for the data codeword; and a MI generator configured to determine a MI value using the set of joint probability values, wherein the controller is further configured to determine a FER estimate using the MI-FER conversion data structure.

14. The system of claim 13, wherein the MI-FER conversion data structure is a lookup table that stores data points of a model.

15. The system of claim 14, wherein the memory controller is further configured to determine the FER estimate using the MI-FER conversion data structure by performing processes that comprise interpolating between the data points of the model or extrapolating beyond the range of the data points of the model to determine a FER estimate that corresponds to the determined MI value.

16. The system of claim 13, wherein the input channels comprise one or more encoded codewords stored in the memory and the output channels comprise data codewords read from the memory.

17. The system of claim 16, wherein encoded codewords stored in the memory page comprise data indicating true bit values that were encoded and programmed to memory.

18. The system of claim 17, wherein the encoded codewords are known test patterns and the data indicating true bit values comprises the test pattern values.

19. The system of claim 13, wherein the conditional probability module is further configured to generate the set of joint probability values by performing processes that comprise determining a count of each true bit value-determined charge state level pair for the decoded data codeword.

20. The system of claim 19, wherein the MI generator is further configured to determine the MI value using relative incidences of the true bit value-determined charge state level pairs.

* * * * *